(12) United States Patent
Vanderberg et al.

(10) Patent No.: US 7,227,160 B1
(45) Date of Patent: Jun. 5, 2007

(54) SYSTEMS AND METHODS FOR BEAM ANGLE ADJUSTMENT IN ION IMPLANTERS

(75) Inventors: Bo H. Vanderberg, Gloucester, MA (US); Edward C. Eisner, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 11/520,190

(22) Filed: Sep. 13, 2006

(51) Int. Cl.
*H01J 37/08* (2006.01)
(52) U.S. Cl. .............................. 250/492.21
(58) Field of Classification Search ........... 250/492.21, 250/396 R, 396 ML
See application file for complete search history.

(56) References Cited

U.S. PATENT DOCUMENTS

| 5,483,077 A | 1/1996 | Glavish |
| 6,881,966 B2 | 4/2005 | Benveniste et al. |
| 2003/0042427 A1* | 3/2003 | Sullivan et al. ............. 250/397 |
| 2006/0219955 A1* | 10/2006 | Ray ...................... 250/492.21 |

* cited by examiner

*Primary Examiner*—Kiet T. Nguyen
(74) *Attorney, Agent, or Firm*—Eschweiler & Associates, LLC

(57) ABSTRACT

An ion implantation system employs a mass analyzer for both mass analysis and angle correction. An ion source generates an ion beam along a beam path. A mass analyzer is located downstream of the ion source that performs mass analysis and angle correction on the ion beam. A resolving aperture within an aperture assembly is located downstream of the mass analyzer component and along the beam path. The resolving aperture has a size and shape according to a selected mass resolution and a beam envelope of the ion beam. An angle measurement system is located downstream of the resolving aperture and obtains an angle of incidence value of the ion beam. A control system derives a magnetic field adjustment for the mass analyzer according to the angle of incidence value of the ion beam from the angle measurement system.

20 Claims, 6 Drawing Sheets

SYSTEMS AND METHODS FOR BEAM ANGLE ADJUSTMENT IN ION IMPLANTERS

FIELD OF THE INVENTION

The present invention relates generally to ion implantation systems, and more specifically to systems and methods for performing beam angle adjustments of ion beams in ion implantation systems.

BACKGROUND OF THE INVENTION

In the manufacture of semiconductor devices, ion implantation is used to dope semiconductors with impurities or dopants. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected extrinsic ion species to produce the desired semiconducting material. Implanting ions generated from source materials such as antimony, arsenic or phosphorus results in "n type" extrinsic material wafers, whereas if "p type" extrinsic material wafers are desired, ions generated with source materials such as boron, or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway can be evacuated to reduce the probability of ions being deflected from the predetermined beam path as a result of collisions with gas molecules.

Trajectories of charged particles of given kinetic energy in a magnetic field will differ for different masses (or charge-to-mass ratios) of these particles. Therefore, the part of an extracted ion beam which reaches a desired area of a semiconductor wafer or other target after passing through a constant magnetic field can be made pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

For some ion implantation systems, the physical size of the beam is smaller than a target workpiece, so the beam is scanned in one or more directions in order to adequately cover a surface of the target workpiece. Generally, an electrostatic or magnetic based scanner scans the ion beam in a fast direction and a mechanical device moves the target workpiece in a slow scan direction in order to provide sufficient cover.

Thereafter the ion beam is directed toward a target end station, which holds a target workpiece. Ions within the ion beam implant into the target workpiece, which is ion implantation. One important characteristic of ion implantation is that there exists a uniform angular distribution of ion flux across the surface of the target workpiece, such as a semiconductor wafer. The angular content of the ion beam defines implant properties through crystal channeling effects or shadowing effects under vertical structures, such as photoresist masks or CMOS transistor gates. A non-uniform angular distribution or angular content of the ion beam can lead to uncontrolled and/or undesired implant properties.

Beam diagnostic equipment can be employed to measure the angle content of ion beams. The measurement data can then be employed to adjust angle characteristics of the ion beam. However, conventional approaches can increase complexity of the ion implantation system and undesirably increase the length of path along which the ion beam travels.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

Aspects of the present invention facilitate ion implantation by performing angle adjustments without additional components being added to ion implantation systems. The aspects employ a mass analyzer to perform selected angle adjustments during ion implantation instead of employing separate and/or additional components.

In accordance with one aspect of the invention, an ion implantation system employs a mass analyzer for both mass analysis and angle correction. An ion source generates an ion beam along a beam path. A mass analyzer is located downstream of the ion source that performs mass analysis and angle correction on the ion beam. A resolving aperture within an aperture assembly is located downstream of the mass analyzer component and along the beam path. The resolving aperture has a size and shape according to a selected mass resolution and a beam envelope of the ion beam. An angle measurement system is located downstream of the resolving aperture and obtains an angle of incidence value of the ion beam. A control system derives a magnetic field adjustment for the mass analyzer according to the angle of incidence value of the ion beam from the angle measurement system. Other systems and methods are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
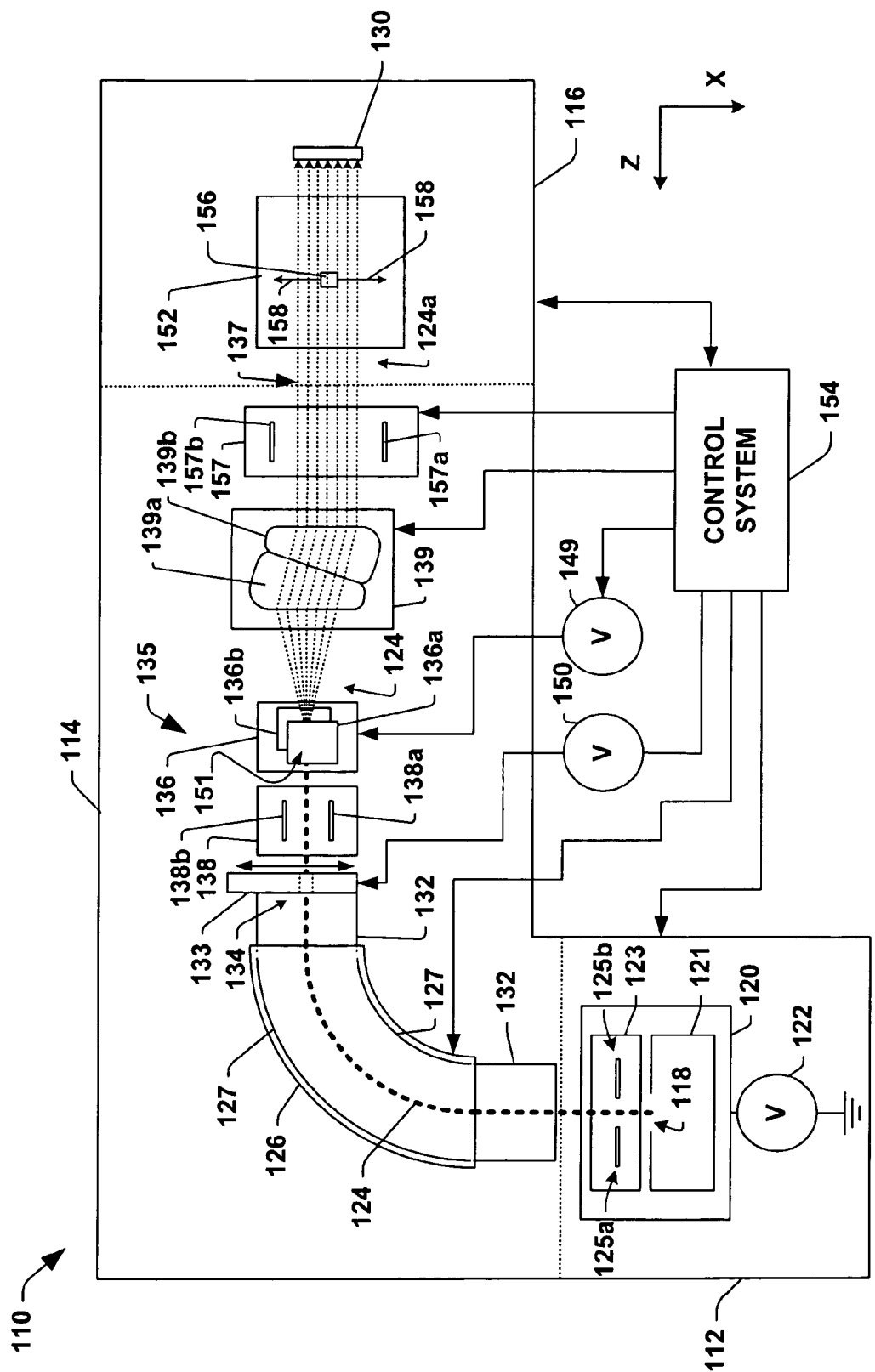
FIG. 1 illustrates an example ion implantation system in accordance with an aspect of the present invention.

The present invention will now be described with reference to the drawings wherein like reference numerals are used to refer to like elements throughout, and wherein the illustrated structures are not necessarily drawn to scale.

Aspects of the present invention facilitate ion implantation employing a mass analyzer to perform angle correction/adjustment in addition to mass analysis. As a result, angle corrections of the implant angle can be performed without additional components along the beam line.

FIG. 1 illustrates an example ion implantation system 110 in accordance with an aspect of the present invention. The system 110 is presented for illustrative purposes and it is appreciated that aspects of the invention are not limited to the described ion implantation system and that other suitable ion implantation systems of varied configurations can also be employed.

The system 110 has a terminal 112, a beamline assembly 114, and an end station 116. The terminal 112 includes an ion source 120 powered by a high voltage power supply 122 that produces and directs an ion beam 124 to the beamline assembly 114. The ion source 120 generates charged ions that are extracted and formed into the ion beam 124, which is directed along a beam path in the beamline assembly 114 to the end station 116.

To generate the ions, a gas of a dopant material (not shown) to be ionized is located within a generation chamber 121 of the ion source 120. The dopant gas can, for example, be fed into the chamber 121 from a gas source (not shown). In addition to power supply 122, it will be appreciated that any number of suitable mechanisms (none of which are shown) can be used to excite free electrons within the ion generation chamber 121, such as RF or microwave excitation sources, electron beam injection sources, electromagnetic sources and/or a cathode which creates an arc discharge within the chamber, for example. The excited electrons collide with the dopant gas molecules and ions are generated thereby. Typically, positive ions are generated although the disclosure herein is applicable to systems wherein negative ions are generated as well.

The ions are controllably extracted through a slit 118 in the chamber 121 by an ion extraction assembly 123, in this example. The ion extraction assembly 123 comprises a plurality of extraction and/or suppression electrodes 125. The extraction assembly 123 can include, for example, a separate extraction power supply (not shown) to bias the extraction and/or suppression electrodes 125 to accelerate the ions from the generation chamber 121. It can be appreciated that since the ion beam 124 comprises like charged particles, the beam may have a tendency to blow up or expand radially outwardly as the like charged particles repel one another. It can also be appreciated that beam blow up can be exacerbated in low energy, high current (high perveance) beams where many like charged particles (e.g., high current) are moving in the same direction relatively slowly (e.g., low energy) such that there is an abundance of repulsive forces among the particles, but little particle momentum to keep the particles moving in the direction of the beam path. Accordingly, the extraction assembly 123 is generally configured so that the beam is extracted at a high energy so that the beam does not blow up (e.g., so that the particles have sufficient momentum to overcome repulsive forces that can lead to beam blow up). Moreover, the beam 124, in this example, is generally transferred at a relatively high energy throughout the system and is reduced just before the workpiece 130 to promote beam containment.

The beamline assembly 114 has a beamguide 132, a mass analyzer 126, a scanning system 135, and a parallelizer 139. The mass analyzer 126 performs mass analysis and angle correction/adjustment on the ion beam 124. The mass analyzer 126, in this example, is formed at about a ninety degree angle and comprises one or more magnets (not shown) that serve to establish a (dipole) magnetic field therein. As the beam 124 enters the mass analyzer 126, it is correspondingly bent by the magnetic field such that ions of an inappropriate charge-to-mass ratio are rejected. More particularly, ions having too great or too small a charge-to-mass ratio are deflected into side walls 127 of the mass analyzer 126. In this manner, the mass analyzer 126 merely allows those ions in the beam 124 which have the desired charge-to-mass ratio to pass there-through and exit through a resolving aperture 134 of an aperture assembly 133.

The mass analyzer 126 can perform angle corrections on the ion beam 124 by controlling or adjusting an amplitude of the magnetic dipole field. This adjustment of the magnetic field causes selected ions having the desired/selected charge-to-mass ratio to travel along a different or altered path. As a result, the resolving aperture 134 can be adjusted according to the altered path. In one example, the aperture assembly 133 is movable about an x direction so as to accommodate altered paths through the aperture 134. In another example, the aperture 134 is shaped so as to accommodate a selected range of altered paths. The mass analyzer 126 and the resolving aperture 134 allow variations in the magnetic field and resulting altered path while maintaining suitable mass resolution for the system 110. More detailed examples of suitable mass analyzer and resolving aperture systems are provided below.

It will be appreciated that ion beam collisions with other particles in the system 110 can degrade beam integrity. Accordingly, one or more pumps (not shown) may be included to evacuate, at least, the beamguide 132 and mass analyzer 126.

The scanning system 135 in the illustrated example includes a magnetic scanning element 136 and a focusing and/or steering element 138. Respective power supplies 149, 150 are operatively coupled to the scanning element 136 and the focusing and steering element 138, and more particularly to respective electromagnet pieces 136a, 136b and electrodes 138a, 138b located therein. The focusing and steering element 138 receives the mass analyzed ion beam 124 having a relatively narrow profile (e.g., a "pencil" beam in the illustrated system 110). A voltage applied by the power supply 150 to the plates 138a and 138b operates to focus and steer the beam to the scan vertex 151 of the scanning element 136. A voltage waveform applied by the power supply 149 (which theoretically could be the same supply as 150) to the electromagnets 136a and 136b then scans the beam 124 back and forth, in this example. It will be appreciated that the scan vertex 151 can be defined as the point in the optical path from which each beamlet or scanned part of the beam appears to originate after having been scanned by the scanning element 136.

The scanned beam 124 is then passed through the parallelizer/corrector 139, which comprises two dipole magnets 139a, 139b in the illustrated example. The dipoles are substantially trapezoidal and are oriented to mirror one another to cause the beam 124 to bend into a substantially s shape. Stated another way, the dipoles have equal angles and radii and opposite directions of curvature.

The parallelizer 139 causes the scanned beam 124 to alter its path such that the beam 124 travels parallel to a beam axis regardless of the scan angle. As a result, the implantation angle is relatively uniform across the workpiece 130.

One or more deceleration stages 157 are located downstream of the parallelization component 139 in this example. Up to this point in the system 110, the beam 124 is generally transported at a relatively high energy level to mitigate the propensity for beam blow up, which can be particularly high where beam density is elevated such as at scan vertex 151, for example. The deceleration stage 157 comprises one or more electrodes 157a, 157b operable to decelerate the beam 124. The electrodes 157 are typically apertures thru which the beam travels, may be drawn as straight lines in FIG. 1.

Nevertheless, it will be appreciated that while two electrodes 125a and 125b, 136a and 136b, 138a and 138b and 157a and 157b are respectively illustrated in the exemplary ion extraction assembly 123, scanning element 136, focusing and steering element 138 and deceleration stage 157, that these elements 123, 136, 138 and 157 may comprise any suitable number of electrodes arranged and biased to accelerate and/or decelerate ions, as well as to focus, bend, deflect, converge, diverge, scan, parallelize and/or decontaminate the ion beam 124 such as provided in U.S. Pat. No. 6,777,696 to Rathmell et al. the entirety of which is hereby incorporated herein by reference. Additionally, the focusing and steering element 138 may comprise electrostatic deflection plates (e.g., one or more pairs thereof), as well as an Einzel lens, quadrupoles and/or other focusing elements to focus the ion beam.

The end station 116 then receives the ion beam 124 which is directed toward a workpiece 130. It is appreciated that different types of end stations 116 may be employed in the implanter 110. For example, a "batch" type end station can simultaneously support multiple workpieces 130 on a rotating support structure, wherein the workpieces 130 are rotated through the path of the ion beam until all the workpieces 130 are completely implanted. A "serial" type end station, on the other hand, supports a single workpiece 130 along the beam path for implantation, wherein multiple workpieces 130 are implanted one at a time in serial fashion, with each workpiece 130 being completely implanted before implantation of the next workpiece 130 begins. In hybrid systems the workpiece 130 may be mechanically translated in a first (Y or slow scan) direction while the beam is scanned in a second (X or fast scan) direction to impart the beam 124 over the entire workpiece 130.

The end station 116 in the illustrated example is a "serial" type end station that supports the single workpiece 130 along the beam path for implantation. A dosimetry system 152 is included in the end station 116 near the workpiece location for calibration measurements prior to implantation operations. During calibration, the beam 124 passes through dosimetry system 152. The dosimetry system 152 includes one or more profilers 156 that may continuously traverse a profiler path 158, thereby measuring the profile of the scanned beams.

The profiler 156, in this example, may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution.

A control system 154 is present that can control, communicate with and/or adjust the ion source 120, the mass analyzer 127, the aperture assembly 133, the magnetic scanner 136, the parallelizer 139, and the dosimetry system 152. The control system 154 may comprise a computer, microprocessor, etc., and may be operable to take measurement values of beam characteristics and adjust parameters accordingly. The control system 154 can be coupled to the terminal 112 from which the beam of ions is generated, as well as the mass analyzer 126 of the beamline assembly 114, the scanning element 136 (e.g., via power supply 149), the focusing and steering element 138 (e.g., via power supply 150), the parallelizer 139 and the deceleration stage 157. Accordingly, any of these elements can be adjusted by the control system 154 to facilitate desired ion. For example, the energy level of the beam can be adapted to adjust junction depths by adjusting the bias applied to electrodes in the ion extraction assembly 123 and the deceleration stage 157, for example.

The strength and orientation of magnetic field(s) generated in the mass analyzer 126 can be adjusted, such as by regulating the amount of electrical current running through field windings therein to alter the charge to mass ratio of the beam, for example. The angle of implantation can be controlled by adjusting the strength or amplitude of the magnetic field(s) generated in the mass analyzer 126 in coordination with the aperture assembly 133. The control system 154 can adjust the magnetic field(s) of the mass analyzer 126 and position of the resolving aperture 134 according to measurement data from, in this example, the profiler 156. The control system 154 can verify the adjustments via additional measurement data and perform additional adjustments via the mass analyzer 126 and the resolving aperture 134 if necessary.

Figure 2:
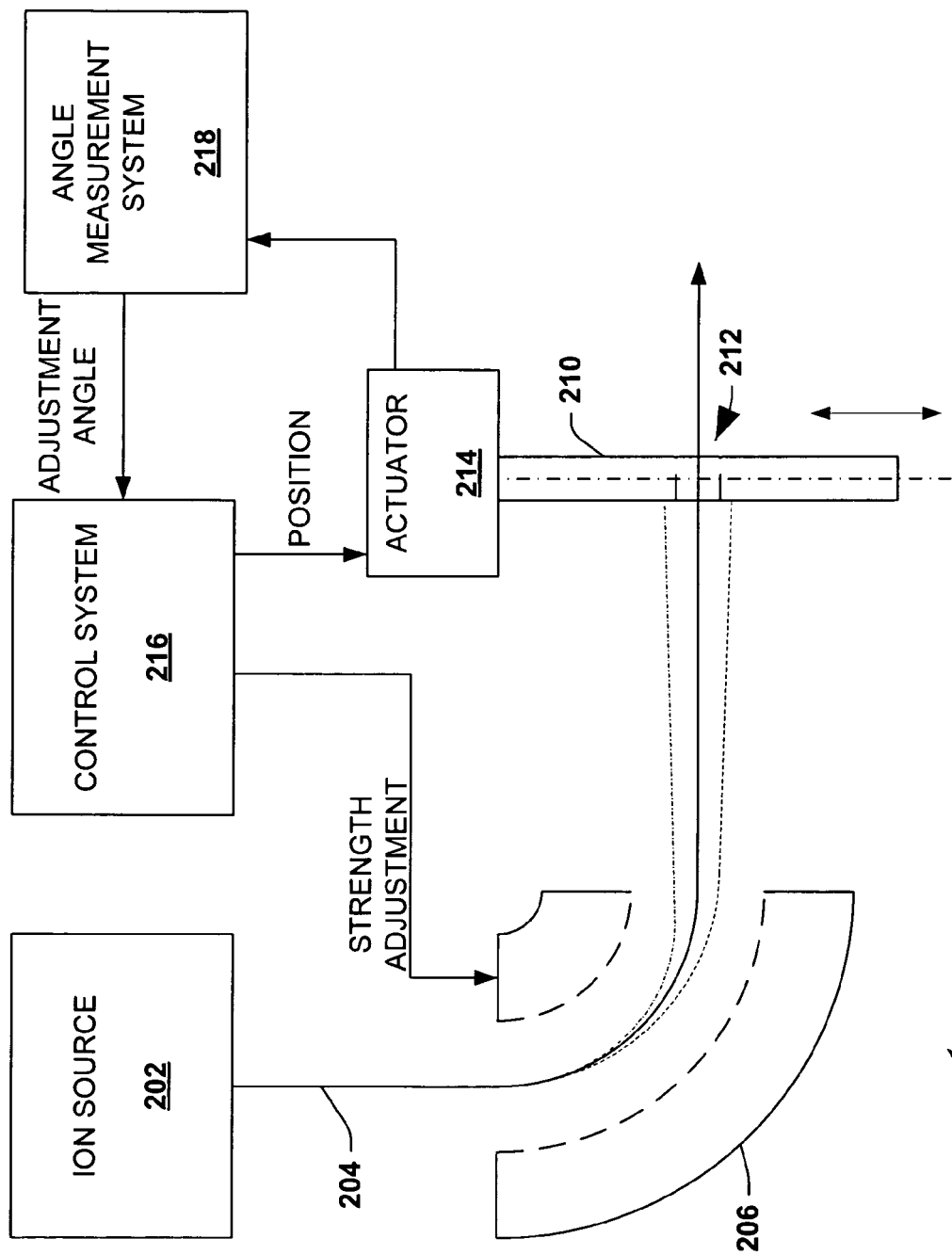
FIG. 2 is a diagram illustrating an ion implantation system employing a mass analyzer for mass analysis and angle correction in accordance with an aspect of the present invention.

FIG. 2 is a diagram illustrating an ion implantation system 200 employing a mass analyzer for mass analysis and angle correction in accordance with an aspect of the present invention. The system 200 is provided as an example and it is appreciated that other variations and configurations can be employed for alternate aspects of the invention.

The system 200 includes an ion source 202 that generates an ion beam 204, a mass analyzer 206, a resolving assembly 210, an actuator 214, a control system 216, and an angle measurement system 218. The ion source 202 can be an arc based source, RF based source, electron gun based source, and the like and generates the ion beam 204 along a beam path having a selected dopant or species of ions for implanting. The ion source 202 provides the ion beam 204 with an initial energy and current.

The mass analyzer 206 is located downstream of the ion source 202 and performs mass analysis and angle correction on the ion beam 204. The mass analyzer 206 generates a magnetic field that causes particles/ions having a selected charge-to-mass ratio to travel along a desired path. The magnetic field can also be adjusted to accommodate for angle corrections to alter the desired path to yield the angle corrections or adjustments.

Although not shown, a quadrupole lens or other focusing mechanism can be positioned downstream of the mass analyzer 206 to compensate or mitigate the impact of beam blow up upon the ion beam 204.

The resolving assembly 210 is positioned downstream of the mass analyzer 206. The resolving assembly 210 includes a resolving aperture 212 through which the ion beam 204 passes through. The aperture 212 permits the selected dopants/species to pass through while preventing other particle from passing through. Additionally, the resolving assembly 210 can be moved along an axis transverse to the path of the ion beam 204. This permits the resolving aperture 212 to be moved in response to changes in the desired path of the ion beam through the mass analyzer 206. The actuator 214 mechanically moves the resolving assembly 210 such that the resolving aperture 212 coincides with a path of the ion beam corresponding to angle adjustments performed by the mass analyzer 206. In other aspects of the invention, the actuator 214 can also select other resolving assemblies to accommodate other resolutions and/or other sized beams.

Generally, the resolving aperture 212 is sized to accommodate the beam envelope of the ion beam 204. However, in alternate aspects, the resolving aperture 212 can be sized to accommodate the beam envelopes across a range of possible beam paths.

The control system 216 is responsible for controlling and initiating angle adjustments during ion implantation as well as controlling mass analysis. The control system 216 is coupled to the mass analyzer 206 and the actuator 214 and controls both components. Another component, the angle measurement system 218, measures angle of incidence values of the ion beam and determines needed adjustment angles. The angle measurement system 218 can employ Faraday cups or some other suitable measurement device to obtain the measured angle of incidence values. Additionally, the angle measurement system 218 can derive or measure an average angle of incidence value for the ion beam 204. The angle measurement system 218 then provides adjustment angles or correction values to the control system 216 based on the measured or derived angle of incidence values and a desired or selected angle of incidence value.

Initially, the control system 216 sets the magnetic field of the mass analyzer 206 at a nominal or base angle value, such as zero, and a selected charge-to-mass ratio. Additionally, the control system 216 sets the initial position of the resoling aperture 212 to coincide with a nominal path associated with the base angle value. During implantation, a non-zero adjustment angle can be received from the angle measurement system 218. Based on the adjustment angle, the control system 216 adjusts the magnetic field of the mass analyzer such that the selected species having the selected charge-to-mass ratio travels along an altered patch corresponding to the adjustment angle. Additionally, the control system 216 also adjusts the positioning of the resolving aperture 212 via the actuator 214 according to the altered path. Thereafter, the angle measurement system 218 can provide additional adjustment angles for further adjustment of the implant angle.

Figure 3A:
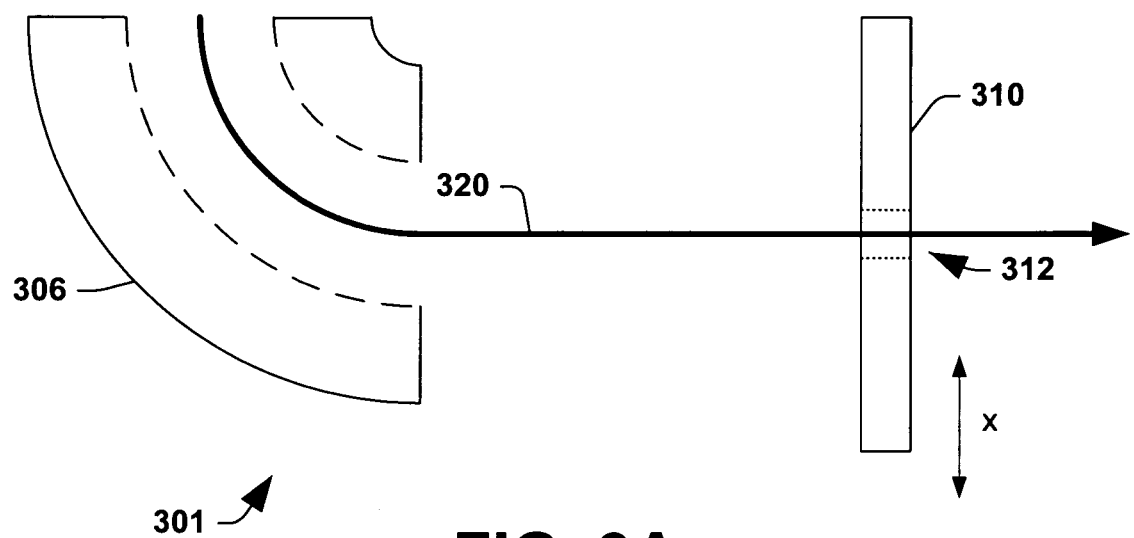
FIG. 3A is a view of a portion of an ion implantation system in accordance with an aspect of the present invention wherein an ion beam travels along a base or nominal path.
Figure 3B:
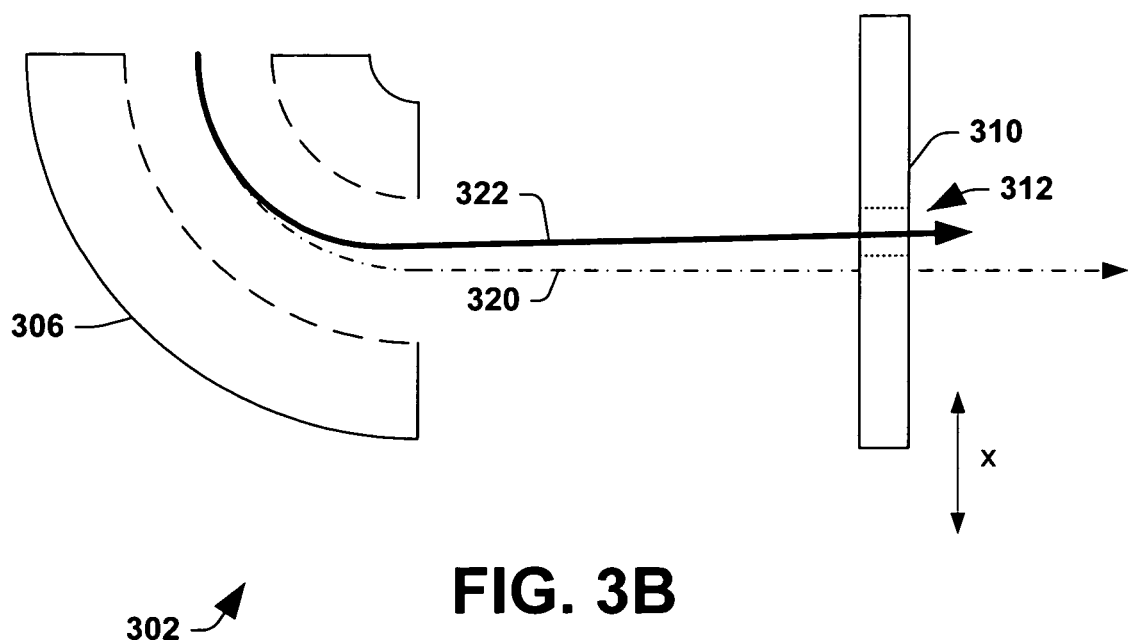
FIG. 3B is a view of a portion of an ion implantation system in accordance with an aspect of the present invention wherein an ion beam travels along an altered path.
Figure 3C:
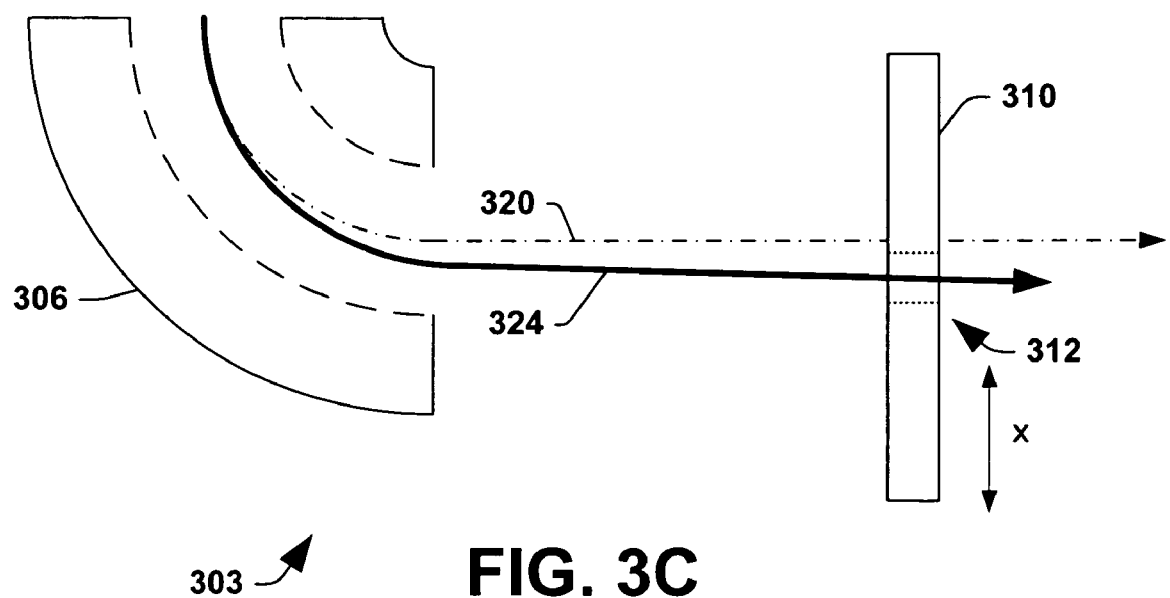
FIG. 3C is another view of a portion of an ion implantation system in accordance with an aspect of the present invention wherein an ion beam travels along an altered path.

FIGS. 3A to 3C are views of a portion of an ion implantation provided to illustrate altered beam paths and angle adjustments in accordance with an aspect of the present invention. The views are provided for illustrative purposes and as examples in order to facilitate understanding of the present invention.

FIG. 3A is a view 301 of a portion of an ion implantation system in accordance with an aspect of the present invention wherein an ion beam travels along a base or nominal path 320.

A mass analyzer 306 is located downstream of an ion source (not shown) and performs mass analysis and angle correction on an ion beam. The mass analyzer 306 generates a magnetic field that causes particles/ions having a selected charge-to-mass ratio to travel along a desired path. The magnetic field can also be adjusted to accommodate for angle corrections to alter the desired path to yield the angle corrections or adjustments. In this figure, the ion beam travels along a base or nominal path 320 associated with the selected charge-to-mass ratio and a nominal or zero angle adjustment. A focusing mechanism (not shown) can be employed downstream of the mass analyzer 306 to compensate or mitigate the impact of beam blow up on the ion beam 304.

The resolving assembly 310 is positioned downstream of the lens 308. The resolving assembly 310 includes a resolving aperture 312 through which the ion beam 304 passes through. The aperture 312 permits the selected dopants/species to pass through while preventing other particle from passing through. Additionally, the resolving assembly 310 can be moved along an axis transverse to the path of the ion beam.

For the nominal path 320, the resolving assembly 310 is placed at a nominal position so that the ion beam can pass through the resolving aperture 312 while blocking other particles from passing through.

FIG. 3B is a view 302 of a portion of the ion implantation system in accordance with an aspect of the present invention wherein an ion beam travels along an altered path 322.

The mass analyzer 306 generates a varied field from that shown and described in FIG. 3A in order to alter the path of the ion beam. In one example, the mass analyzer 306 increases the magnitude of the magnetic field generated. As a result, the ion beam travels along the altered path 322 instead of the nominal path 320. The altered path 322 corresponds to a first angle adjustment or offset. The altered path 322 passes through the lens 308 and toward the resolving assembly 310.

In this view 302, the resolving assembly 310 is moved in a positive direction such that the resolving aperture 312 permits passage of the ion beam there through along the altered path 322.

Similarly, FIG. 3C is another view 303 of a portion of the ion implantation system in accordance with an aspect of the present invention wherein an ion beam travels along an altered path 324.

Again, the mass analyzer 306 generates a varied field from that shown and described FIG. 3A and FIG. 3B in order to alter the path of the ion beam. In one example, the mass analyzer 306 decreases the magnitude of the magnetic field generated. As a result, the ion beam travels along the altered path 324 instead of the nominal path 320. The altered path 324 corresponds to a second angle adjustment or offset. The altered path 324 passes through the lens 308 and toward the resolving assembly 310. The resolving assembly 310 is positioned in a negative direction, in this example, such that the resolving aperture 312 permits passage of the ion beam there through along the altered path 324 while blocking non selected species and unwanted particles.

As stated above, the resolving aperture assembly comprises a resolving aperture through which an ion beam travels. The shape and size of the resolving aperture is generally dependent upon the mass resolution and a size and shape of a desired ion beam, also referred to as the beam envelope. A larger resolving aperture yields lower beam resolution in that more unwanted particles and ions can pass through such an aperture. Similarly, a smaller resolving aperture yields greater beam resolution in that less unwanted particles and ions can pass through such an aperture. However, the higher resolution can also prevent more of the selected or desired species from passing through the resolving aperture, thereby causing undesired beam current loss. Thus, resolving apertures are typically sized according to a desired mass resolution and beam envelope.

Additionally, the resolving aperture of the present invention can also be designed to accommodate varied beam paths corresponding to a range of possible angle adjustments. The above FIGS. 3A to 3C depict some examples of some possible varied paths. The resolving aperture can be appropriately sized to accommodate such varied beam paths.

Figure 4:
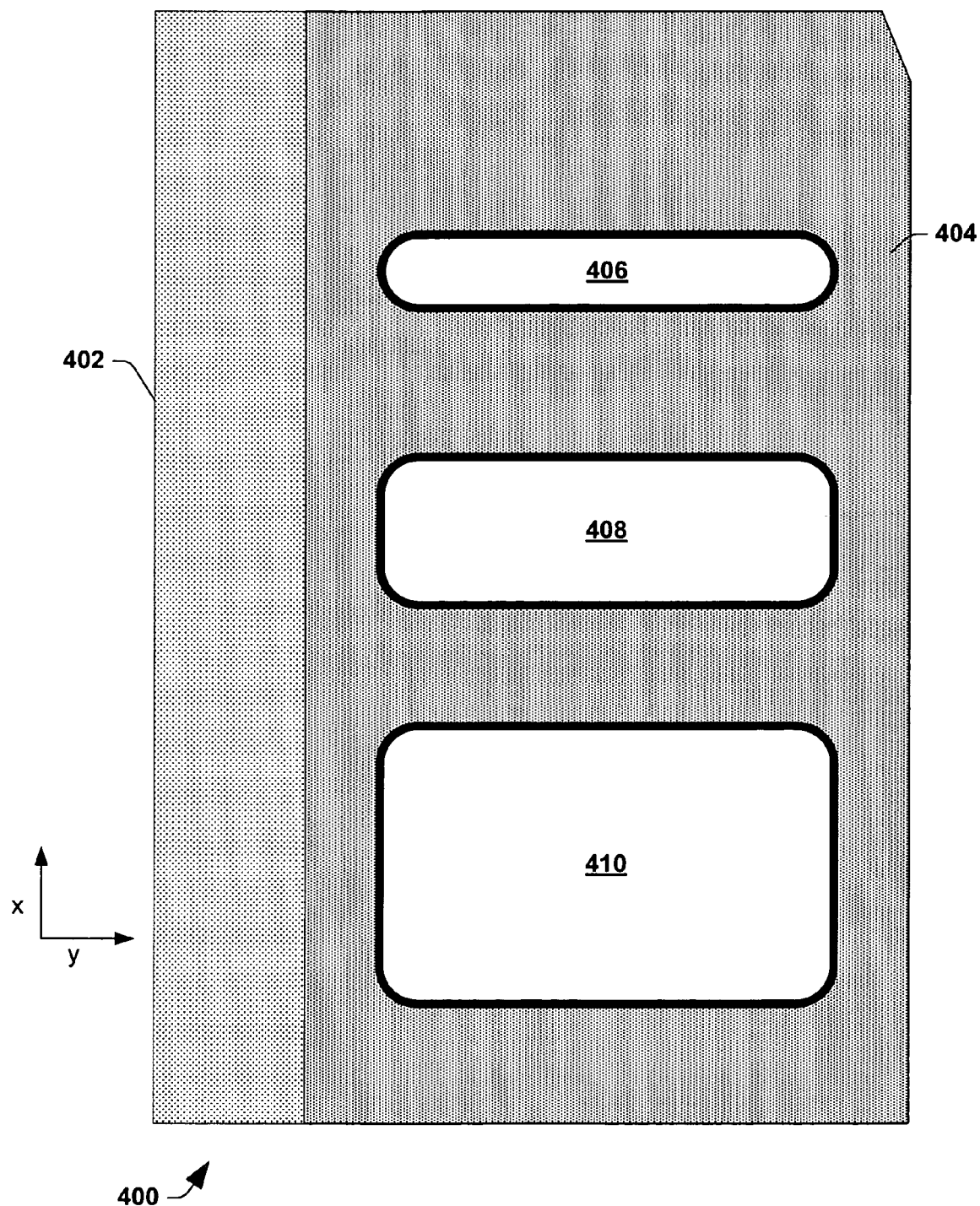
FIG. 4 is a side view of a resolving aperture assembly in accordance with an aspect of the present invention.

FIG. 4 is a side view of a resolving aperture assembly 400 in accordance with an aspect of the present invention. The view is provided as an example and is not intended to limit the invention. The assembly 400, in this example, can accommodate removable plates that allow changing the resolving aperture employed. Additionally, the assembly 400, in this example, can operate with varied shaped beams and/or varied mass resolutions. Thus different sized beams can be employed within such systems and different plates can be employed to accommodate the varied beam envelopes. Additionally, different plates can be employed to accommodate for varied resolutions and ranges of angle adjustments.

In FIG. 4, the assembly 400 comprises an arm 402 that holds a resolving plate 404. The resolving plate 404 includes a plurality of resolving apertures 406, 408, 410 that selected sizes and shapes, which can correspond to selected beam envelopes, selected resolutions, and/or ranges of angle adjustments.

The first aperture 406 has a selected size and shape that correspond to a beam envelope, selected resolution, and/or range of angle adjustments. In this example, the x direction of the first aperture is relatively small. Thus, for example, the first aperture 406 could accommodate a relatively thin ribbon or scanned ion beam.

The second aperture 408 has a second selected size and a second shape that correspond to a second beam envelope, a second selected resolution, and/or a second range of angle adjustments. As an example, the second aperture 408 could accommodate a medium thickness ribbon or scanned ion beam.

The third aperture 410 has a third selected size and a third shape that correspond to a third beam envelope, a third selected resolution, and/or a third range of angle adjustments. As an example, the third aperture could accommodate a relatively thick ribbon or scanned ion beam.

It is noted that the y direction for the apertures 406, 408, 410 is depicted as similar for illustrative purposes, however aspects of the invention can also include variations in the y direction. Additionally, aspects of the invention can include more or less apertures on a single plate.

During operation, the assembly 400 is positioned such that one of the apertures is positioned along a path of an ion beam to remove contaminants or unselected material from the ion beam. The selected aperture corresponds to a selected beam envelope and/or selected mass resolution. It is appreciated that materials or portions of the beam may pass through one of the non selected apertures, but those portions are not generally propagated to a target workpiece.

Figure 5:
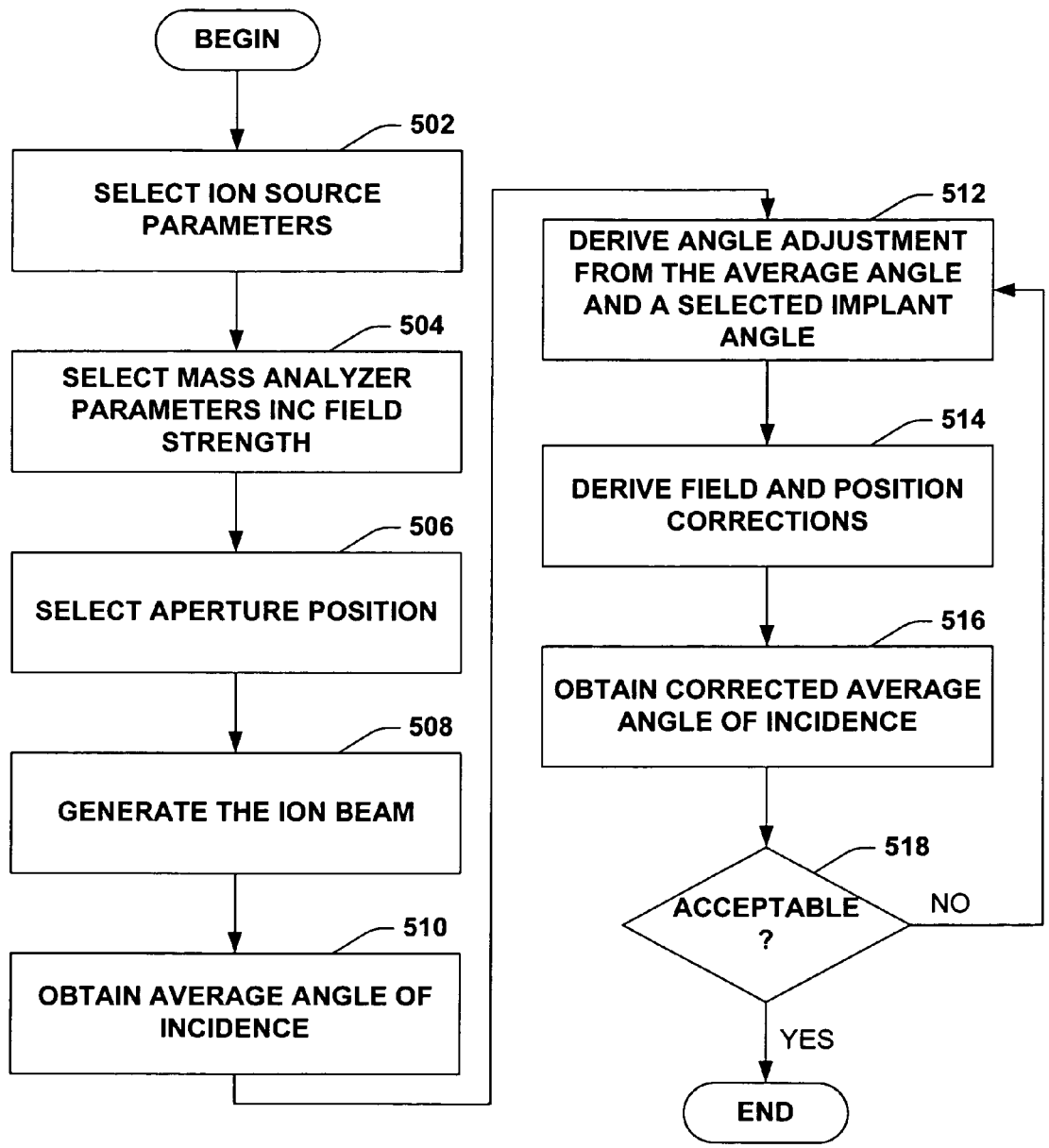
FIG. 5 is a flow diagram of a method of adjusting the angle of implantation in accordance with an aspect of the present invention.

FIG. 5 is a flow diagram of a method 500 of adjusting the angle of implantation in accordance with an aspect of the present invention. The method 500 can facilitate uniform angular distribution of ion flux across the surface of a workpiece during ion implantation by correcting or adjusting the angle of implant. It is appreciated that the above figures and descriptions can also be referenced for the method 500.

The method 500 begins at block 502 wherein parameters of an ion source are selected according to a desired specie, energy, current, and the like. The ion source can be an arc based or non arc based ion source, such as an RF or electron gun base ion source. The specie or species can be selected by selecting one or more source materials for the ion source. The current can be selected by modulating power values and/or electrodes.

Parameters of a mass analyzer are selected at block 504 according to a charge-to-mass ratio corresponding to the selected species and a base or nominal angle. The parameters, such as current applied to coil windings, are set to yield a magnetic field that causes the selected specie to travel along a nominal or base path corresponding to the nominal angle and pass through the mass analyzer.

An initial positioning of a resolving aperture is also selected at block 506. The initial positioning corresponds to the base path and permits passage there through according to a selected mass resolution.

An ion beam is generated as ion implantation is initiated at block 508. An average angle of incidence for the ion beam is obtained at block 510. The average angle of incidence can be measured in one example. In another example, multiple beam angle measurements are obtained and an average value is derived there from. It is noted that other beam measurements and angle values can also be employed. For example, calculations of the average angle through an optical train of an ion implanter can be employed taking into account the effects of acceleration and/or deceleration whenever applicable.

An angle adjustment is derived from a selected angle of implant and the average angle obtained at block 512. For example, if the selected angle is equal to the average angle, the angle adjustment is zero. A magnetic field correction and aperture position correction are determined and applied at block 514 according to the angle adjustment. The magnetic field correction adjusts the path of the ion beam to correct the angle of the ion beam. The aperture position correction moves the resolving aperture so that the selected species can pass there through.

It is noted that the angle adjustment and/or magnetic field correction can be limited so as to prevent over adjustment. Also, errors in the angle adjustment can be reduced by employing iterative correction algorithms. In such instances, suitable angle correction can take a number of passes.

A corrected average angle of implant is obtained at block 516 after applying the field and position corrections. The corrected average angle of implant is obtained as in block 510. If the second average angle is not sufficiently close to the selected angle of implant or within an acceptable tolerance, as determined at block 518, the method returns to block 510 and continues iteratively until the average angle of the ion beam is within the acceptable tolerance of the selected angle.

It is appreciated that the method 500 is described in the above order in order to facilitate an understanding of the present invention. It is noted that the method 500 can be performed with other suitable orderings in accordance with the present invention. Additionally, some blocks can be omitted and other additional functions performed in other aspects of the invention.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system comprising:
    an ion source that generates an ion beam along a beam path;
    a mass analyzer downstream of the ion source that performs mass analysis and angle correction on the ion beam;
    a resolving aperture within an aperture assembly downstream of the mass analyzer component and along the beam path having a size and shape according to a selected mass resolution and a beam envelope;
    an angle measurement system downstream of the resolving aperture that obtains an angle of incidence value of the ion beam; and
    a control system that derives a magnetic field adjustment for the mass analyzer according to the angle of incidence value of the ion beam from the angle measurement system.

2. The system of claim 1, further comprising an actuator coupled to the aperture assembly for moving the aperture assembly.

3. The system of claim 2, wherein the control system further derives a position adjustment for the resolving aperture according to the angle of incidence value of the ion beam from the angle measurement system and the actuator moves the aperture assembly according to the position adjustment.

4. The system of claim 1, wherein the resolving aperture has a size and shape further according to a range of possible angle adjustments by the mass analyzer.

5. The system of claim 1, wherein the mass analyzer comprises an electromagnet having coils and wherein current flowing through the coils is controlled by the control system.

6. The system of claim 1, further comprising a second resolving aperture within a second aperture assembly having a size and shape according to a second mass resolution and a second beam envelope, wherein the control system positions one of the aperture assembly and the second aperture assembly along the beam path.

7. The system of claim 1, wherein the angle measurement system comprises a measurement cup movable across the ion beam that measures a plurality of angle of incidence values at plurality of locations.

8. The system of claim 7, wherein the angle measurement system derives the angle of incidence value from the plurality of angle of incidence values.

9. The system of claim 1, wherein the angle of incidence value is an average angle of incidence value across the ion beam.

10. The system of claim 1, further comprising:
    a magnetic scanner downstream of the resolving aperture component that generates a time varying oscillatory magnetic field across a portion of the beam path;
    a parallelizer downstream of the magnetic scanner that redirects the ion beam parallel to a common axis; and
    an end station positioned downstream of the parallelizer component that receives the ion beam.

11. The system of claim 1, wherein the control system derives an angle adjustment from a selected angle of implant and the angle of incidence value from the angle measurement system and derives the magnetic field adjustment according to the angle adjustment.

12. The system of claim 1, wherein the magnetic field adjustment is limited by a threshold value.

13. A method of performing ion implantation comprising:
    selecting ion source parameters for an ion source;
    selecting an initial magnetic field strength for a mass analyzer according to a charge-to-mass ratio;
    generating an ion beam according to the selected ion source parameters;
    performing mass analysis on the ion beam by the mass analyzer;
    obtaining an angle of incidence value for the ion beam;
    deriving an angle adjustment value according to the obtained angle of incidence value and a selected implant angle; and
    deriving a magnetic field correction according to the derived angle adjustment.

14. The method of claim 13, further comprising setting an initial position for a resolving aperture.

15. The method of claim 14, further comprising removing non-selected portions of the ion beam after performing mass analysis.

16. The method of claim 15, further comprising deriving a position adjustment value for the resolving aperture according to the derived angle adjustment and applying the position adjustment to the resolving aperture.

17. The method of claim 13, further comprising applying the magnetic field correction to the mass analyzer.

18. The method of claim 17, further comprising obtaining a corrected angle of incidence value for the ion beam.

19. The method of claim 18, further comprising comparing the corrected angle of incidence to the selected implant angle to determine if additional angle correction is needed.

20. The method of claim 13, wherein obtaining the angle of incidence comprises measuring angles at one or more locations proximate to a target workpiece.

* * * * *